US008893059B2

(12) United States Patent
Carroll (10) Patent No.: US 8,893,059 B2
(45) Date of Patent: Nov. 18, 2014

(54) PATTERN DATA SYSTEM FOR HIGH-PERFORMANCE MASKLESS ELECTRON BEAM LITHOGRAPHY (71) Applicant: KLA-Tencor Corporation, Milpitas, CA (US)

(72) Inventor: Allen Carroll, San Jose, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 13/754,760

(22) Filed: Jan. 30, 2013

(65) Prior Publication Data

US 2013/0205267 A1 Aug. 8, 2013

Related U.S. Application Data (60) Provisional application No. 61/595,376, filed on Feb. 6, 2012.

(51) Int. Cl.
*G06F 17/50* (2006.01)
*G03F 1/36* (2012.01)

(52) U.S. Cl.
CPC .............. *G06F 17/5068* (2013.01); *G03F 1/36* (2013.01)
USPC .................................. 716/53; 716/51; 716/55

(58) Field of Classification Search
CPC ........... G03F 1/36; G03F 7/70; G03F 7/2063; G03F 7/70441
USPC ....................................................... 716/50–56
See application file for complete search history.

(56) References Cited

U.S. PATENT DOCUMENTS

| | | | |
|---|---|---|---|
| 6,717,097 B1 | 4/2004 | Sandstrom et al. | |
| 2011/0226970 A1* | 9/2011 | Krecinic et al. | 250/492.22 |
| 2012/0286173 A1 | 11/2012 | Van De Peut et al. | |
| 2012/0287410 A1 | 11/2012 | Wieland et al. | |
| 2013/0037730 A1 | 2/2013 | Slot et al. | |
| 2013/0061187 A1 | 3/2013 | Wang et al. | |

* cited by examiner

*Primary Examiner* — Paul Dinh
(74) *Attorney, Agent, or Firm* — Okamoto & Benedicto LLP (57) ABSTRACT One embodiment relates to a pattern data system for maskless electron beam lithography. The system includes a renderer that receives pre-exposure die image data, performs rendering of the pre-exposure die image data to generate raster data. The system further includes a plurality of data distributors communicatively coupled to the renderer. Each data distributor adapts the raster data to characteristics of an associated pattern writer. Other embodiments, aspects and feature are also disclosed.

18 Claims, 6 Drawing Sheets

PATTERN DATA SYSTEM FOR HIGH-PERFORMANCE MASKLESS ELECTRON BEAM LITHOGRAPHY

CROSS-REFERENCE TO RELATED APPLICATION(S)

The present application claims the benefit of provisional U.S. Patent Application No. 61/595,376, filed Feb. 6, 2012, entitled "Pattern Data System for High-Performance Maskless E-beam Lithography," the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

1. Technical Field

The present invention relates to a pattern data system for maskless lithography.

2. Description of the Background Art

The amount of data required to specify a layer in a contemporary integrated circuit (IC) is very large. Hence, a vast amount of IC device-layer pattern data needs to be manipulated at high-speed in a maskless electron beam (e-beam) lithography system with commercially-practical throughput rates.

It is highly challenging and problematic to rapidly prepare this large amount of data for the maskless e-beam lithography system. Further challenges are presented in efficiently storing the large amount of data prior to wafer lithography and transmitting it efficiently to the system's pattern writers during the lithography process.

SUMMARY

One embodiment relates to a pattern data system for maskless electron beam lithography. The system includes a renderer that receives pre-exposure die image data, performs rendering of the pre-exposure die image data to generate raster data. The system further includes a plurality of data distributors communicatively coupled to the renderer. Each data distributor adapts the raster data to characteristics of an associated pattern writer.

Another embodiment relates to a method of generating and distributing pattern data in a maskless electron beam lithography system. A pre-exposure die image data is received, and the pre-exposure die image data is rendered to generate raster data. The pre-exposure die image data is distributed to each of a plurality of data distributors, and each data distributor adapts the image data to characteristics of an associated pattern writer.

Other embodiments, aspects and feature are also disclosed.

BRIEF DESCRIPTION OF THE DRAWINGS

Note that the figures are not necessarily to scale and are intended to illustrate embodiments of the invention for purposes of providing a clear explanation of the invention.

DETAILED DESCRIPTION

As mentioned above, it is highly challenging to overcome the problems of preparing, storing and transmitting the very large amount of pattern data required for maskless electron beam lithography. The present disclosure provides a pattern data system which overcomes these challenges in an effective and efficient manner.

In addition to preparing, storing and transmitting the pattern data, subtle corrections to the pattern data may be needed to compensate for the lithography tool's characteristic distortions. If the system has transducers ("print heads") to write the data pattern simultaneously on multiple wafers, then these subtle corrections may be unique for each transducer.

Consider, for example, a maskless e-beam lithography system that employs multiple linear stages and multiple e-beam columns printing simultaneously on one or more semiconductor wafers. In one implementation, any one wafer may be printed by a single e-beam column. In another implementation, each wafer may be printed by multiple e-beam columns.

In order to print device-layer patterns on the wafers at commercially practical rates, the transducers which impress pattern information on the electron beams must be supplied with data at extremely high data rates. Each transducer, which may be implemented using a dynamic pattern generator (DPG), is generally electrically isolated at a high potential relative to ground, typically 50,000 volts or more. Because the data supply systems are at ground potential, reliable high-speed data transmission to the transducers requires the use of fiber-optical communications, which are generally point-to-point links, and this constrains the data communication architecture to a certain extent.

Also, each e-beam column is expected to have some degree of individuality in terms of its characteristic distortions. This makes it desirable to customize the data stream to each transducer.

Furthermore, it may be desirable to print various wafers in different directions. For example, it may be desirable to print one subset of wafers in a left-to-right order, and another subset of wafers in a right-to-left order. This may be desirable so as to balance dynamic mechanical disturbances.

For example, when printing a wafer lot, the multiple e-beam columns in a maskless lithography system may be configured to print a common device-layer design pattern simultaneously on multiple wafers. However, the high-speed data streams supplied to the transducers are independent of one another (despite being derived from the common device-layer design pattern).

As discussed above, there are various inter-dependent problems that are to be overcome by the pattern data system disclosed herein. In addition, the pattern data system disclosed herein provides sufficient flexibility to print "mixed lots" in which different circuit designs are printed on different wafers.

Further flexibility allows different circuit designs to be printed on the multiple dies on a single wafer. For example, a first circuit design may be printed on a first subset of dies on a wafer, and a second circuit design may be printed on a second subset of dies on the wafer.

Figure 1:
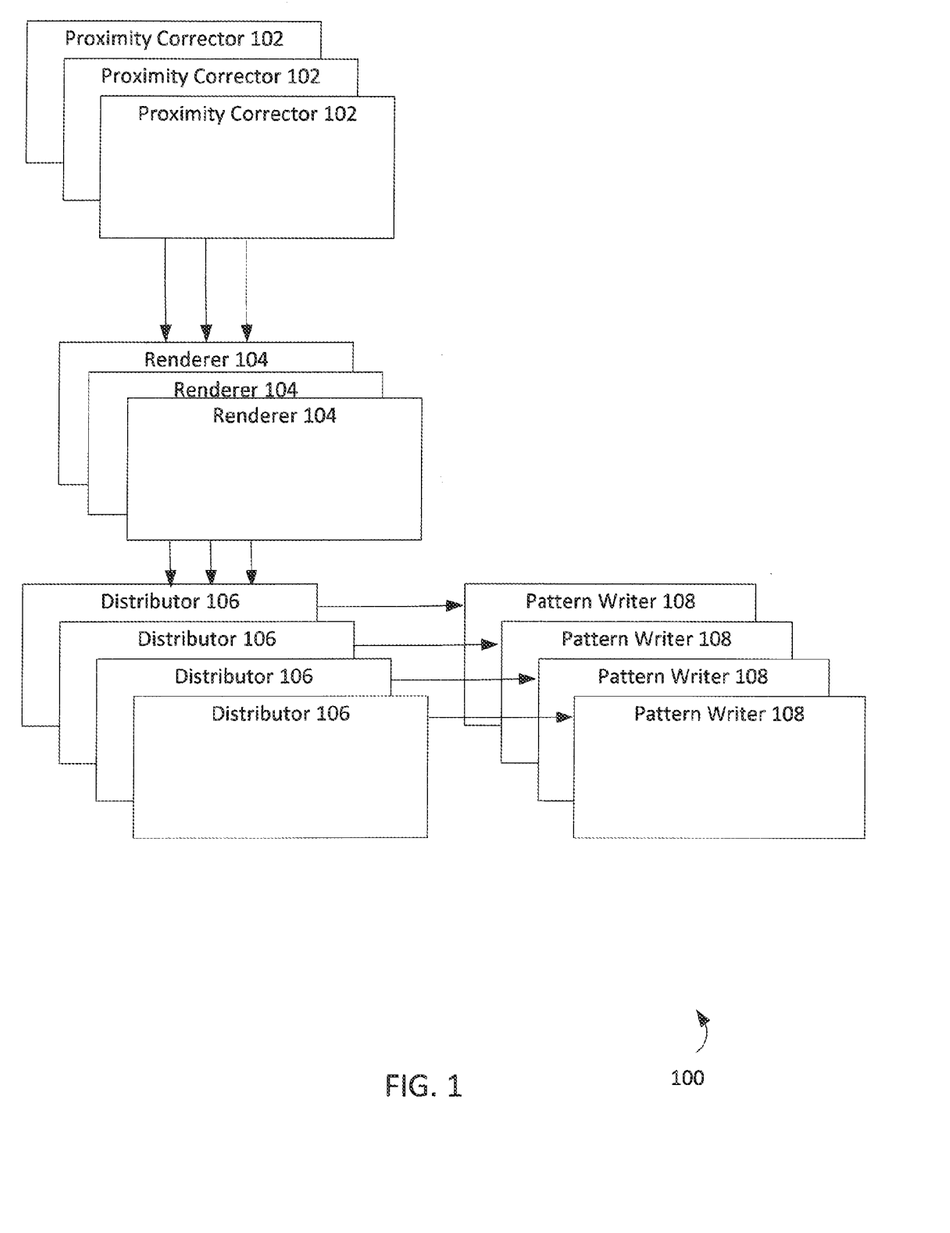
FIG. 1 is a schematic diagram showing components for a pattern data system for maskless electron beam lithography in accordance with an embodiment of the invention.

FIG. 1 is a schematic diagram showing components for a pattern data system 100 for maskless electron beam lithography in accordance with an embodiment of the invention. As shown, the system 100 includes one or more proximity correctors 102, one or more renderers 104, a plurality of distributors 106, and a plurality of pattern writers (transducers) 108.

Each proximity corrector 102 may receive an input design file and pre-corrects the design file for proximity effects. The output of the proximity corrector 102 may be a pre-exposure die image (PDI) file. Data processing performed by the proximity corrector 102 may be implemented using software stored in memory and executed by a processor. In one embodiment, the PDI file or collection of files that is output by a proximity corrector 102 may be expressed in vector-graphics format with additional annotations which express the modulations required by the proximity correction.

Multiple proximity correctors 102 may be used for increased throughput. For example, a first set of dies on the wafer may be written with design A, a second set of dies on the wafer may be written with design B, and a third set of dies on the wafer may be written with design C. In this case, three proximity correctors 102 may be used to increase throughput: a first performing the proximity correction for design A; a second performing the proximity correction for design B; and a third for performing the proximity correction for design C. Alternatively, a single proximity corrector may be used to perform the proximity correction for the multiple designs sequentially.

In accordance with an embodiment of the invention, the proximity correctors 102 are each configured to correct for proximity effects due to electron beam scattering caused by bulk silicon and also by device layers already present on the wafer when the layer under consideration is being printed. This electron beam scattering results in energy deposition in the resist at some distance from the features being patterned.

Multiple renderers 104 may be used to increase throughput. Alternatively, a single renderer 104 may be used. The one or more renderers 104 may be referred to as a rendering subsystem. The renderer(s) 104 may receive the one or more PDI files (which specify microfield definitions) from the proximity correctors 102 and may also receive a "field definition file" which specifies the layout of dies within a field. In an exemplary implementation, the renderers 104 may be implemented using programmable circuitry and/or hard-wired circuitry. The renderer(s) 104 may convert the one or more PDI files or file collections to a format that is more closely adapted to the e-beam lithography exposure process which may use, for example, a "raster-gray" method to print the IC patterns. In the raster-gray method, the artwork to be printed is represented as a raster image in which the pixel elements are assigned an intensity representing the amount of beam energy to be deposited at that pixel's location. The raster-gray method allows final, developed feature edges to be placed with a precision substantially smaller than the pixel size.

The renderer(s) 104 may render and generically correct the micro-field data (which includes the micro-field references and micro-field definitions). The correction is generic in that it is not specific to a particular pattern writer. The resultant image data may be in the form of raster data in that it is suitably-ordered to be written in a raster pattern. The raster data may be compressed, and the compressed raster data may be stored and transmitted in the form of one file or more files. One embodiment of a renderer 104 is described below in relation to FIG. 4.

Each of the plurality of distributors 106 may receive the compressed raster data from the renderer(s) 104. In one implementation, the compressed raster data may be sent to the distributors 106 using a daisy chain network structure. Alternatively, the compressed raster data may be sent to the distributors 106 by broadcast over a network. As mentioned above, the field data may be compressed and in the form of one file or multiple files. Each distributor 106 may be configured to decompress the field data and adapt the uncompressed raster data to suit an associated pattern writer 108 (i.e. to suit the particular e-beam column which writes the dynamic pattern driven by the distributor 106), to order it for a particular print direction, and/or to partition it according to an allocation of data to this pattern writer 108.

After adapting the raster data, each distributor 106 may re-compress the raster data and output a data structure to the dynamic pattern generator (DPG) of the associated pattern writer (transducer). The data structure may be in the form of multiple files or lists of packets. The data structure (in form of files or packets) may be pre-fetched by the distributor 106 and transmitted via fiber-optic links from the distributor 106 to the DPG of the pattern writer 108. In one embodiment, each data structure may correspond to the pattern data for an area which is one field in length and one swath in width (i.e. a field-swath), where the fields and swaths are described below in relation to FIG. 2. Each DPG may perform a final de-compression of the pattern data prior to printing the pattern data onto the target substrate.

Figure 2:
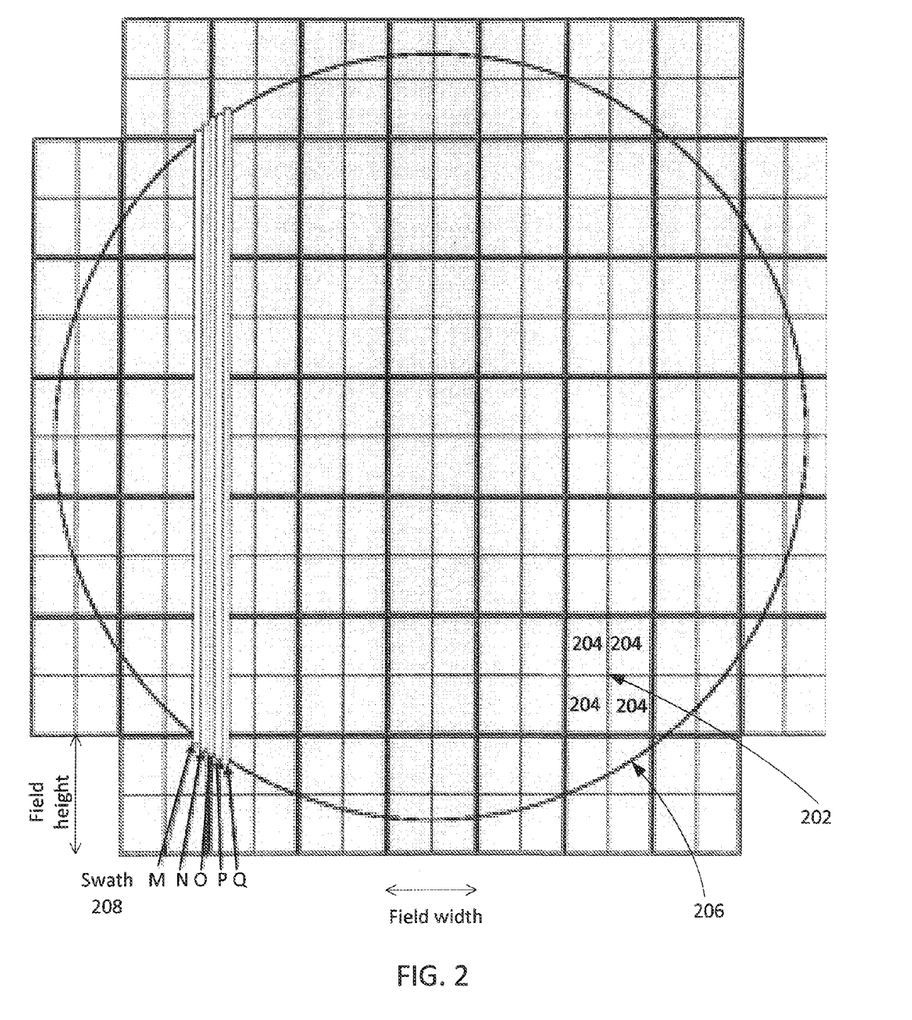
FIG. 2 depicts a few example paths (swaths) for a digital pattern generated image across a semiconductor wafer in accordance with an embodiment of the invention.

FIG. 2 depicts a few example paths (swaths) for a digital pattern generated image across a semiconductor wafer in accordance with an embodiment of the invention. The larger rectangles (outlined by thicker lines) represent fields (which may be referred to as "stepper" fields) 202, and the smaller rectangles (outlined by thinner lines) represent dies 204 within each field. In the example depicted, each field 202 includes a two-by-two array of four dies 204. More generally, a field 202 may include an m-by-n array of dies, where m and n are counting numbers. In addition, note that a narrow "frame" of the field 202 surrounds the array of dies 204. The frame of the field 202 may contain test structures. The circle represents the perimeter of an actual wafer 206.

In accordance with an embodiment of the invention, an e-beam column with a dynamic pattern generator (DPG) may print raster-gray data on the wafer in a series of swaths. The swaths may be quite narrow when compared to the die dimensions. For example, whereas an IC die may be on the order of one centimeter square or so, a swath of exposure may be less than a hundred microns wide. The DPG, which may contain on its surface a programmable array of electron mirrors, may print the rasterized image on the wafer surface in a swath-by-swath manner by shifting the raster-gray rendered pattern data across the mirror array in synchronization with the wafer motion.

Hence, the digital pattern generated image may be moved in a raster pattern over the wafer 206 so as to cover swaths 208 of exposure. In the figure, several example swaths are shown (M, N, O, P and Q). Note that the swaths 208 in FIG. 2 are not to scale. In an exemplary implementation, for instance, each swath may be 80 microns wide, and it may take approximately 3,500 swaths to cover an entire wafer.

In accordance with an embodiment of the invention, the system stores units of data which are one field in length and one swath in width. The unit of data may be referred to as a field-swath. The data for a swath may then consist of endpieces which are partial field-swaths plus several entire field-swaths between them, as seen in FIG. 2.

In further accord with an embodiment of the invention, the width of the field 202 may be an exact multiple of the projected height of the DPG array. This optional feature is advantageous in that the projected height of the DPG corresponds to the width of a swath 208. Hence, the width of the field 202 may be exactly covered by multiple swaths 208. This advantageously enables pattern-dependent corrections to be performed just once for each field-swath and then re-used for the corresponding field-swath in subsequently-printed fields. In other cases, the field width may not be a multiple of the projected DPG height, and a portion of the final swath covering the field may be blank (though this would cause some features in a rectangular area in the adjacent field to have a higher background dose). In other cases, the demagnification of the projection lens may be adjusted (for example, by a few parts per thousand) to change the projected DPG height so that it does divide the stepper field evenly.

Note that multiple PDI files from the proximity correctors 102 may be combined into a single rendered field. For example, the multiple PDI files may correspond to two IC designs that are being manufactured on a single wafer for convenience and economy. As another example, one or more PDI files may be for test structures and/or process monitor structures that may be combined with the IC design artwork (which is provided separately in one or more PDI files).

Figure 3:
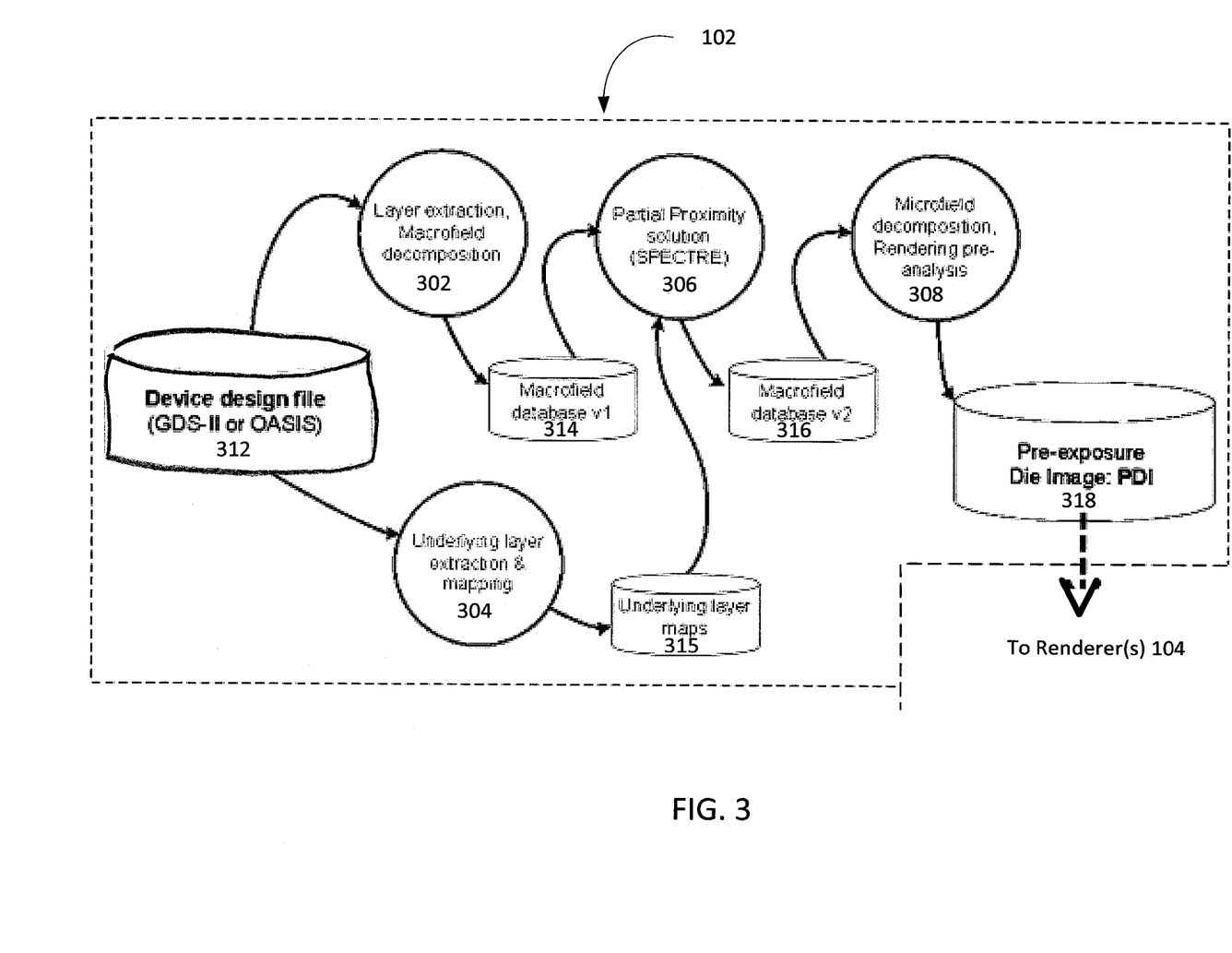
FIG. 3 depicts an exemplary proximity corrector in accordance with an embodiment of the invention.

FIG. 3 depicts an exemplary proximity corrector 102 in accordance with an embodiment of the invention. As shown, the proximity corrector 102 may include a macro-field decomposer 302, an under-layer mapper 304, a proximity solver 306, and a micro-field decomposer 308.

The macro-field decomposer 302 may receive and process data from a device design file 312. The device design files 312 may be stored in data storage in one of a variety of formats, such as GDS-II or OASIS, for example. The device design file 312 may include pattern data for multiple layers of a device design to be manufactured on a wafer. The macro-field decomposer 302 may extract the pattern data for a specific layer in the device design and may perform macro-field decomposition for that layer. A macro-field corresponds to a segment or region of the device design. The resultant macro-field data may be stored in a first macro-field database (version 1 or v1) 314.

The underlying-layer mapper 304 may also receive and process data from a device design file 312. The underlying-layer mapper 304 may extract the pattern data for layers underlying the specific layer being processed and may perform mapping so as to generate underlying layer maps.

The proximity solver 306 may process and analyze the macro-field data from the first macro-field database and the underlying layer maps. The proximity solver 306 may apply, for example, a self-consistent proximity effect correction technique for resist exposure (SPECTRE), so as to at least partially correct the macro-field data for proximity effects. The resultant corrected macro-field data may be stored in a second macro-field database (version 2 or v2) 316.

The micro-field decomposer 308 may receive and process the corrected macro-field data from the second macro-field database 316. The micro-field decomposer 308 may perform further decomposition to generate micro-field data and may also perform rendering pre-analysis to generate a pre-exposure die image (PDI) 318. A micro-field is a segment or region of a macro-field. The micro-field data may include micro-field definitions and micro-field references. A micro-field definition defines pattern data for a micro-field area, while a micro-field reference indicates the location for placement of a specific micro-field definition. In other words, a micro-field reference indicates which micro-field definition to use and the location at which that micro-field definition is to be placed.

Figure 4:
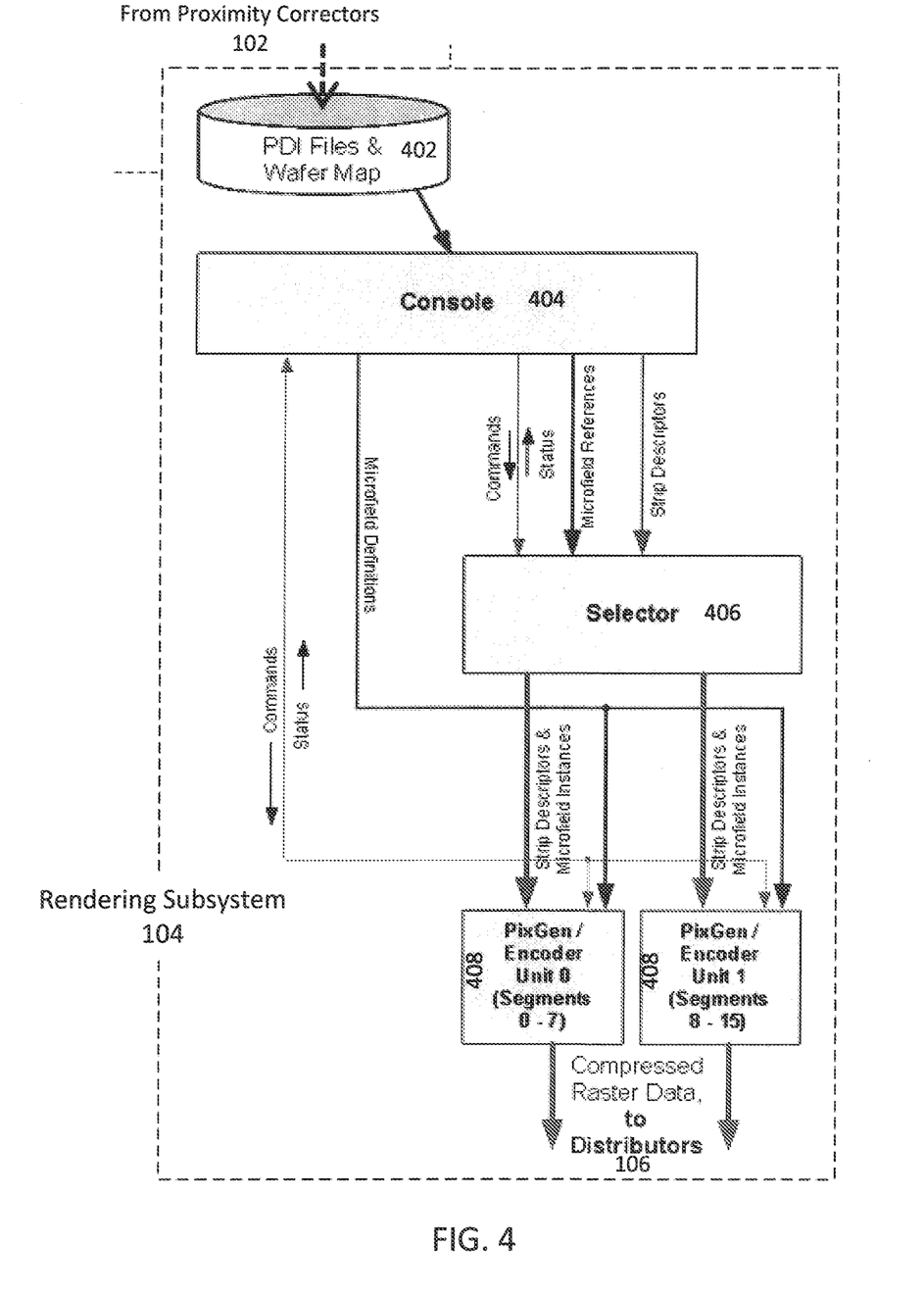
FIG. 4 depicts an exemplary rendering sub-system in accordance with an embodiment of the invention.

FIG. 4 depicts an exemplary renderer 104 in accordance with an embodiment of the invention. The renderer 104 may include data storage 402, a console module 404, a selector 406, and multiple pixel generation and encoder units (PixGen/Encoder Units) 408.

The renderer 104 may receive and store the PDI files and the wafer map in the data storage 402. The wafer map may be provided by the user and relates to the field layout for the wafer. The console module 404 may retrieve and utilize the PDI files and the wafer map from the data storage 404.

The console module 404 may function as a controller for the renderer 104. The console module 404 may send commands and data to, and receive status messages from, the selector module 406. The data sent to the selector module 326 may, for example, include micro-field references and strip descriptors. Swath data may be divided into strips to assist in managing the Rendering process, as suggested in FIG. 6. Using strips of moderate size can also help control round-off errors in the rendering process.

The console module 404 may also send commands and data to, and receive status messages from, each of the PixGen/Encoder Units 408. The data sent to each pixel generation encoder 408 may, for example, include micro-field definitions.

The selector 406 may select and send strip descriptors and micro-field instances to the PixGen/Encoder Units 408. Shown in the exemplary embodiment of FIG. 4 are two units (PixGen/Encoder Unit 0 and PixGen/Encoder Unit 1). However, more than two such units may also be utilized depending on the implementation.

Each PixGen/Encoder Unit 408 may be communicatively connected to the plurality of distributors 106. Each PixGen/Encoder Unit 328 processes the strip descriptors, micro-field instances and micro-field definitions so as to generate compressed raster data to be sent to the distributors 106. While a micro-field reference carries coordinates referenced to the die origin, the micro-field instance placement vector is referenced to the field origin. As depicted, for example, PixGen/Encoder Unit 0 may generate the compressed raster data for a first set of segments (Segments 0 to 7) of the DPG array, while PixGen/Encoder Unit 1 may generate the compressed raster data for a second set of segments (Segments 8 to 15) of the DPG array.

Figure 5:
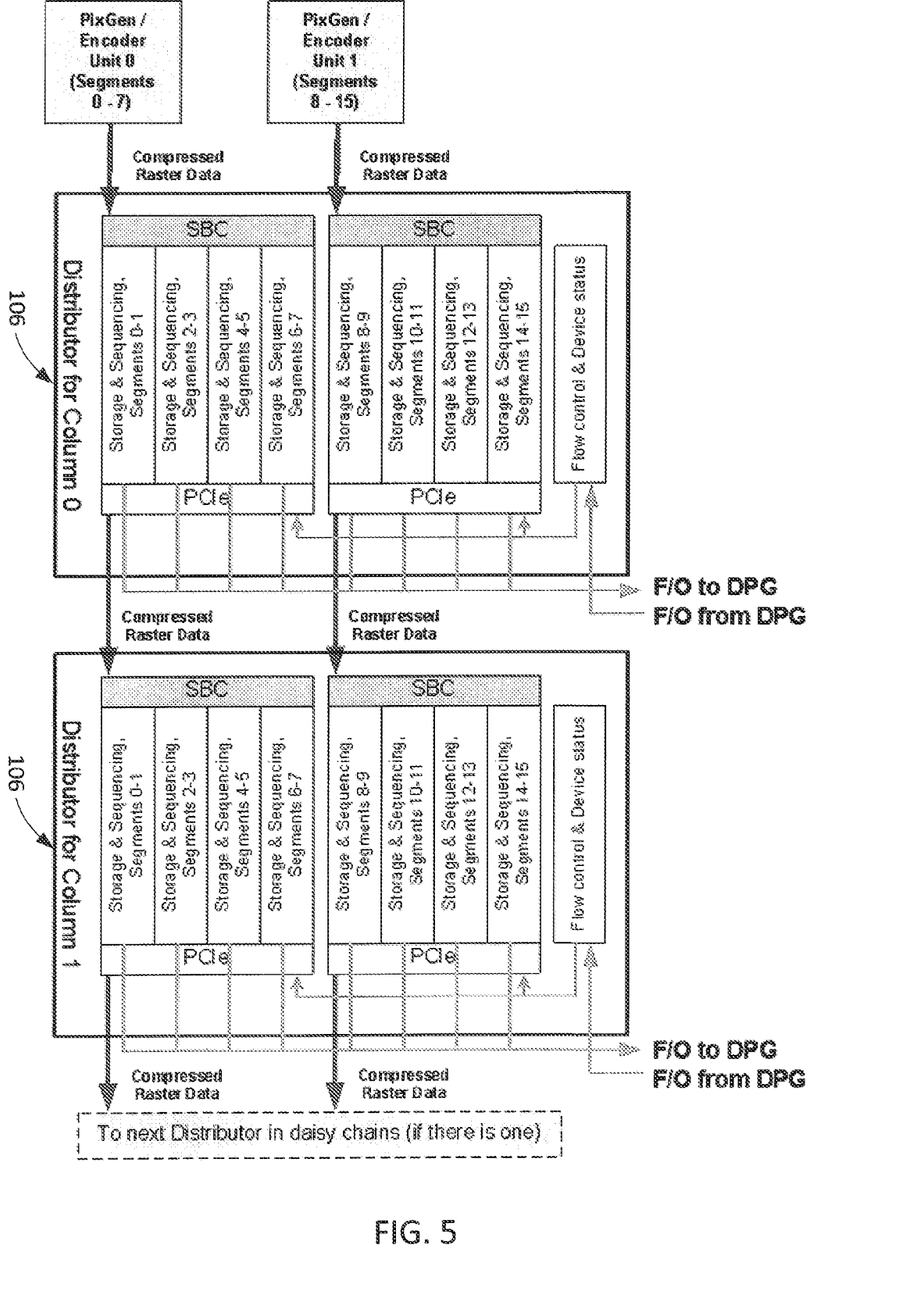
FIG. 5 depicts exemplary data distributors in accordance with an embodiment of the invention.

FIG. 5 depicts exemplary data distributors 106 in accordance with an embodiment of the invention. Note that two distributors 106 are depicted in FIG. 5, one for Column 0 and another for Column 1. However, it is anticipated that a manufacturing system may include more than two distributors 106 so as to drive a corresponding number of pattern writers 108. Further distributors 106 may be added to this communication structure, in one-to-one correspondence with the pattern writers which must be supplied with pattern data.

Each distributor 106 may receive compressed raster data from the PixGen/Encoder Units 408 of the renderer(s) 104. Input interfaces may receive the compressed raster data. For example, a high-speed interface (for example, 40 gigabit Ethernet™ or another high-speed serial interface) may be used to receive the compressed raster data from an upstream source in the daisy chain and to send the compressed raster data to a downstream (i.e. next) distributor in the daisy chain.

A single-board computer (SBC) which may access solid-state drive data storage may process the data in the data distributor 106. A high-speed interface (for example, PCI Express™, also known as PCIe™) may be used to interface between the SBC and plurality of storage and sequencing units.

The storage and sequencing units may store and sequence segments of the raster data. In the implementation shown, there are four storage and sequencing units for each SBC, each unit storing and sequencing two segments of the raster data and sending these two segments of raster data via a fiber optic (F/O) connection to the DPG of the associated pattern writer 108.

The plurality of storage and sequencing units may be controlled by a flow control and device status unit for the distributor 106. The flow control and device status unit may receive control data from the DPG associated with that distributor 106 and may provide control commands to the plurality of storage and sequencing units.

Figure 6:
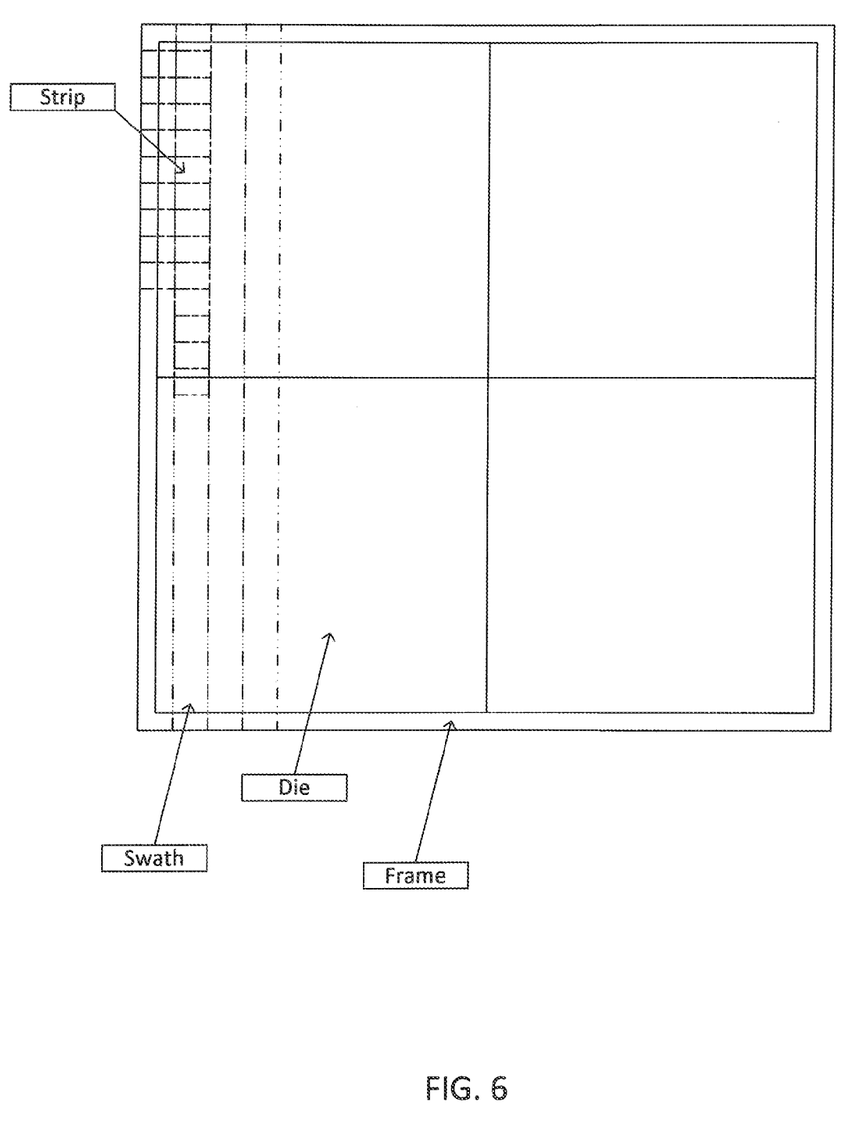
FIG. 6 depicts an exemplary field layout in accordance with an embodiment of the invention.

FIG. 6 depicts an exemplary field layout in accordance with an embodiment of the invention. The field layout shows four dies within a frame. In addition, the field layout depicts swaths that may be partitioned into strips.

The above-described diagrams are not necessarily to scale and are intended to be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A pattern data system for maskless electron beam lithography, the system comprising:
   a renderer that receives pre-exposure die image data, performs rendering of the pre-exposure die image data to generate raster data;
   a plurality of data distributors communicatively coupled to the renderer, wherein each data distributor adapts the raster data to characteristics of an associated pattern writer; and
   a plurality of proximity correctors, wherein a proximity corrector processes design data for a device so as to generate the pre-exposure die image data, and wherein the proximity corrector comprises
      a macro-field decomposer that extracts design data for a layer of the device and decomposes the design data for the layer to generate macro-field data which is stored in a first macro-field database,
      an underlying-layer mapper that extracts design data for layers underlying the layer of the device and performs mapping to generate underlying layer maps, and
      a proximity solver that processes the macro-field data from the first database and the underlying layer maps so as to correct the macro-field data for proximity effects.

2. The pattern data system of claim 1, wherein one-to-one links are used to communicatively interconnect each data distributor and the associated pattern writer.

3. The pattern data system of claim 2, wherein the one-to-one links comprise fiber-optic links.

4. The pattern data system of claim 1, wherein the renderer compresses the raster data prior to transmission of the raster data to the plurality of data distributors, and wherein the data distributors decompress the raster data prior to adapting the raster data.

5. The pattern data system of claim 4, wherein the renderer recompresses the raster data after the adaptation has been performed.

6. The pattern data system of claim 1, wherein the proximity corrector further comprises:
   a second macro-field database that stores corrected macro-field data from the proximity solver; and
   a micro-field decomposer that decomposes the corrected macro-field data to generate micro-field data and performs rendering pre-analysis to generate the pre-exposure die image data.

7. The pattern data system of claim 6, wherein the micro-field data is stored and distributed in field-swath units of data, wherein a field-swath unit of data comprises data for an area that is one field in length and one swath in width.

8. The pattern data system of claim 1, wherein the renderer comprises:
   a console module that obtains the pre-exposure die image data, wherein a pre-exposure die image data includes micro-field definitions and micro-field references, and wherein a micro-field definition defines a pattern for a micro-field area, and a micro-field reference indicates a location for placing a specified micro-field definition.

9. The pattern data system of claim 1, wherein the raster data is communicated to the data distributors using a daisy chain network structure.

10. The pattern data system of claim 1, wherein the raster data is communicated to the data distributors by broadcast over a network.

11. A pattern data system for maskless electron beam lithography, the system comprising:
   a renderer that receives pre-exposure die image data, performs rendering of the pre-exposure die image data to generate raster data; and
   a plurality of data distributors communicatively coupled to the renderer, wherein each data distributor adapts the raster data to characteristics of an associated pattern writer, wherein the renderer comprises
      a console module that obtains the pre-exposure die image data, wherein a pre-exposure die image data includes micro-field definitions and micro-field references, and wherein a micro-field definition defines a pattern for a micro-field area, and a micro-field reference indicates a location for placing a specified micro-field definition,
      a selector module that receives the micro-field references and strip descriptors from the console module, and
      a plurality of pixel generation and encoder units that each receive the micro-field definitions from the console module and selected micro-field references and strip descriptors from the selector module and that each generate the raster data for a subset of pixels to be written, where the strip descriptors are means for partitioning and organizing the rendering.

12. A method of generating and distributing pattern data in a maskless electron beam lithography system, the method comprising:
processing design data for a device so as to generate pre-exposure die image data, wherein processing the design data comprises
extracting design data for a layer of the device,
decomposing the design data for the layer to generate macro-field data which is stored in a first macro-field database,
extracting design data for layers underlying the layer of the device,
performing mapping to generate underlying layer maps, and
processing the macro-field data from the first database and the underlying layer maps so as to correct the macro-field data for proximity effects;
receiving the pre-exposure die image data by a rendering subsystem implemented using electronic circuitry;
performing rendering of the pre-exposure die image data by the rendering subsystem to generate raster data;
distributing the pre-exposure die image data from the rendering subsystem to each of a plurality of data distributors; and
adapting the raster data by each data distributor to characteristics of an associated pattern writer.

13. The method of claim 12, wherein a plurality of one-to-one links are used to communicatively interconnect each data distributor and the associated pattern writer.

14. The method of claim 13, wherein the raster data is compressed prior to transmission of the raster data to the plurality of data distributors, and wherein the data distributors decompress the raster data prior to adapting the raster data and recompress the data after adaptation has been performed.

15. The method of claim 12, wherein processing the design data further comprises:
storing corrected macro-field data in a second macro-field database;
decomposing the corrected macro-field data to generate micro-field data; and
performing rendering pre-analysis to generate the pre-exposure die image data.

16. The method of claim 15, wherein the micro-field data is stored and distributed in field-swath units of data, wherein a field-swath unit of data comprises data for an area that is one field in length and one swath in width.

17. The method of claim 12, wherein the pre-exposure die image data includes micro-field definitions and micro-field references, and wherein a micro-field definition defines a pattern for a micro-field area, a micro-field reference indicates a location for placing a specified micro-field definition.

18. A method of generating and distributing pattern data in a maskless electron beam lithography system, the method comprising:
receiving pre-exposure die image data by a rendering subsystem implemented using electronic circuitry;
performing rendering of the pre-exposure die image data by the rendering subsystem to generate raster data;
distributing the pre-exposure die image data from the rendering subsystem to each of a plurality of data distributors; and
adapting the raster data by each data distributor to characteristics of an associated pattern writer,
wherein the pre-exposure die image data includes micro-field definitions and micro-field references, and wherein a micro-field definition defines a pattern for a micro-field area, a micro-field reference indicates a location for placing a specified micro-field definition, and
wherein the rendering is performed using a plurality of pixel generation and encoder units that
receive the micro-field definitions from a console module,
receive selected micro-field references and strip descriptors from a selector module, and
generate the raster data for a subset of pixels to be written from the micro-field definitions, the selected micro-field references and the strip descriptors.

* * * * *